United States Patent [19]

Munter

[11] 4,367,456

[45] Jan. 4, 1983

[54] PCM AND PAM CONVERSION CIRCUIT INCLUDING SIGNAL LEVEL VARIATION ON THE PCM PORTION OF THE CIRCUIT

[75] Inventor: Ernst A. Munter, Ottawa, Canada

[73] Assignee: Northern Telecom Limited, Montreal, Canada

[21] Appl. No.: 19,258

[22] Filed: Mar. 9, 1979

[51] Int. Cl.³ .......................................... H03K 13/02
[52] U.S. Cl. .................... 340/347 C; 340/347 AD; 340/347 DA; 340/347 M; 328/168; 375/98
[58] Field of Search ................ 340/347 C, 347 M; 179/15 BL, 16 F; 370/113; 328/168; 375/98

[56] References Cited

U.S. PATENT DOCUMENTS

| | | | |
|---|---|---|---|
| 3,504,286 | 3/1970 | Jacobaeus | 375/25 X |
| 3,656,152 | 4/1972 | Gundersen | 340/347 DA X |
| 3,790,910 | 2/1974 | McCormack | 235/92 MT X |
| 3,877,028 | 4/1975 | Thomas | 340/347 C X |
| 3,883,864 | 5/1975 | Thomas | 340/347 C X |
| 3,900,844 | 8/1975 | Wald | 340/347 C |
| 3,906,488 | 9/1975 | Suarez-Gartner | 340/347 C |
| 3,984,829 | 10/1976 | Zwack | 340/347 C |
| 4,016,557 | 4/1977 | Zitelli et al. | 340/347 M X |
| 4,021,652 | 5/1977 | Munter | 364/715 X |
| 4,056,820 | 11/1977 | Hofer | 340/347 C |
| 4,118,773 | 10/1978 | Raguin et al. | 364/200 |
| 4,121,055 | 10/1978 | Doherty | 370/113 |

OTHER PUBLICATIONS

The Engineering Staff of Analog Devices, Inc., Analog-Digital Conversion Handbook, 6/1972, pp. I—64 & 65.
Intel 2316E 16,384 Bit Static ROM publication, Intel Corp., 7/1977 3 sheets.

Primary Examiner—T. J. Sloyan
Attorney, Agent, or Firm—Robert C. Hogeboom

[57] ABSTRACT

A conversion circuit for use with digital telephone switching equipment for converting pulse amplitude modulation (PAM) signals into pulse code modulated (PCM) signals and for converting PCM signals into PAM signals. When these conversions are done it is desirable to adjust the magnitude of the signals involved to take into account the differing losses in the associated analogue circuitry. The present invention employs digital pads, in the digital portion of the conversion circuit and controlled by a storage register, in order to introduce variations in the signal levels.

4 Claims, 4 Drawing Figures

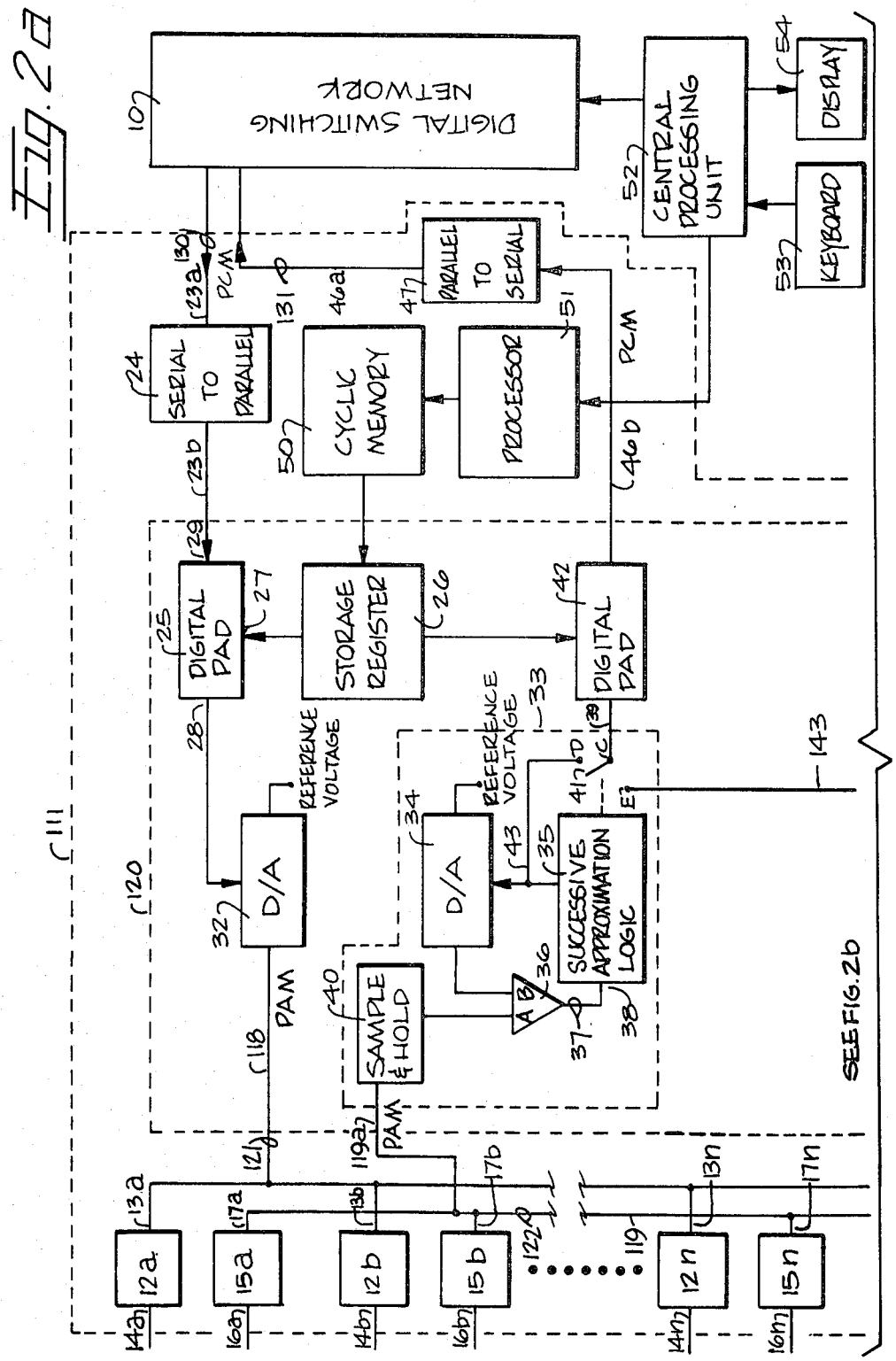

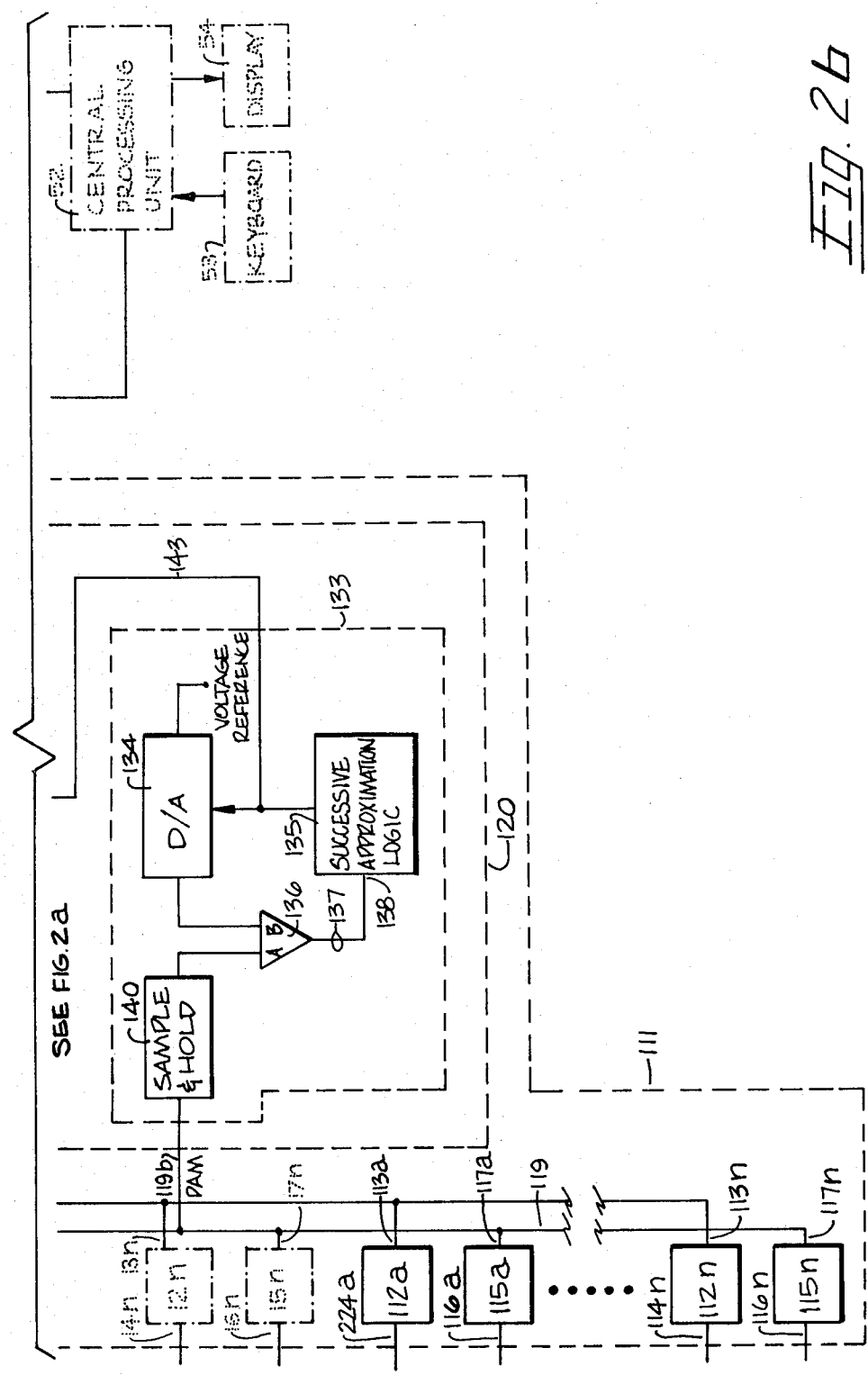

PCM AND PAM CONVERSION CIRCUIT INCLUDING SIGNAL LEVEL VARIATION ON THE PCM PORTION OF THE CIRCUIT

BACKGROUND OF THE INVENTION

This invention relates to digital telephone equipment employing pulse code modulation (PCM). More particularly, it relates to the control of transmission levels on telephone trunk circuits; and more particularly yet, to the control of transmission levels on the digital portion of an encorder-decoder apparatus, commonly referred to in the art as a "codec".

Telephone equipment employing pulse code modulation (PCM) is now well known. One important interface in digital telephone switching equipment is the interface between the analogue signals (which originate at a subscriber's telephone set) and the PCM digital signals employed in the digital switching equipment itself. Equipment for performing both the function of encoding the analogue signals into PCM digital signals and the function of decoding the PCM digital signals into analogue signals are commonly referred to as "codecs". The attenuation presented to the analogue side of these codecs by the associated wiring (e.g. trunk circuits) is variable due to differing lengths of wire, etc. In order to overcome this problem various methods have been employed to control the transmission levels on analogue telephone trunk circuits.

These various methods include the use of potentiometers, switches, plug-in resistor networks, screw-down pads, etc., in order to permit initial and periodic adjustment of transmission levels of such equipment as voice-frequency amplifiers, analogue or digital carrier equipment, and of simple metallic paths. In the preceding methods, the variation in signal level is always introduced in the analogue voice frequency path, even with the digital carrier equipment.

Some sample encoder-decoder devices of the prior art are depicted in the following patents: U.S. Pat. No. 3,877,028 dated Apr. 8, 1975 to R. M. Thomas; U.S. Pat. No. 3,883,864 dated May 13, 1975 to R. M. Thomas; and U.S. Pat. No. 3,906,488 dated Sept. 16, 1975 to R. E. Suarez-Gartner.

SUMMARY OF THE INVENTION

The present invention is an encoder-decoder device (i.e. conversion circuit) which introduces this variation in the transmission level, not in the analogue portion, but rather, in the digital portion of the device.

Briefly stated, the present invention is a conversion circuit that is used both for interfacing digital (e.g. PCM) and PAM (Pulse Amplitude Modulation) signals and for selectively modifying the digital signal so as to control the amplitude of the resultant analogue signal that can be decoded from the digital signal. It should be noted that this invention includes both conversion from digital to PAM and also PAM to digital. In one embodiment of the invention (the "receive" only embodiment) the codec of the present invention is a time-shared device, time-shared between thirty-two different voice channels. A storage device (such as a storage register) is employed to store sequentially, thirty-two digital codes (one for each voice channel) representing the variation in signal strength required for the voice channel occurring at that period in time; note that for the preferred embodiment including both the transmit and the receive directions the storage device stores sequentially, sixty-four digital codes (two for each voice channel, and each code stored for at least the time period of two bits, but not more than one half the time period of one voice channel) representing the variation in signal strength required for the voice channel (both transmit and receive) occurring at that period in time. This storage device is loaded with a single code once for each voice channel (in the "receive" only embodiment) from a cyclic memory device which stores permanently (until deliberately changed) the thirty-two digital codes required for the thirty-two voice channels. The cyclic memory device, as the name implies, provides at its output, the digital codes stored therein, in a regular and cyclical fashion one at a time; these are the codes that are then applied, as they appear on the output of the cyclic memory device, to the storage register.

The preferred embodiment of this invention additionally includes means for changing the codes stored in the cyclic memory directly from a Central Processing Unit (CPU) when required.

Stated in different terms, the present invention is a conversion circuit for use with a digital telephone switching network, both for converting transmitted pulse amplitude modulation (PAM) signals into transmitted pulse code modulation (PCM) signals and for converting received PCM signals into received PAM signals, the conversion circuit characterized by: a receive circuit for converting received PCM signals into received PAM signals, the receive circuit comprising a first controllable code-converter means connected in series with the digital input of a digital-to-analogue converter, wherein the input of the first code-converter means is responsive to the received PCM signal, and the output of the first code-converter means is a PCM signal applied to the input of the digital-to-analogue converter, the output of which is the received PAM signal; a transmit circuit for converting transmitted PAM signals into transmitted PCM signals, the transmit circuit comprising an analogue-to-digital converter connected in series with a second controllable code-converter means, wherein the input of the analogue-to-digital converter is responsive to the transmitted PAM signal, and the output of the analogue-to-digital converter is a PCM signal applied to the input of the second code-converter means, the output of which is the transmitted PCM signal; and a first storage means for controlling the operation of both the first and the second code-converter means to thereby control the amount of variation of the digital signal passing through the code-converter means and to thereby control the magnitude of any resultant analogue signal derived therefrom, wherein the first storage means is accessed twice every voice channel in order to store the appropriate digital code, in the first storage means, for controlling the amount of variation caused by the first and second code-converter means.

BRIEF DESCRIPTION OF THE DRAWINGS

The invention will now be described in more detail with reference to the accompanying drawings, in which:

FIGS. 2a and 2b together form a simplified block diagram depicting the preferred embodiment of the invention, and for ease of description the FIGS. 2a and 2b together will be referred to as FIG. 2.

DETAILED DESCRIPTION OF THE INVENTION

Figure 1:
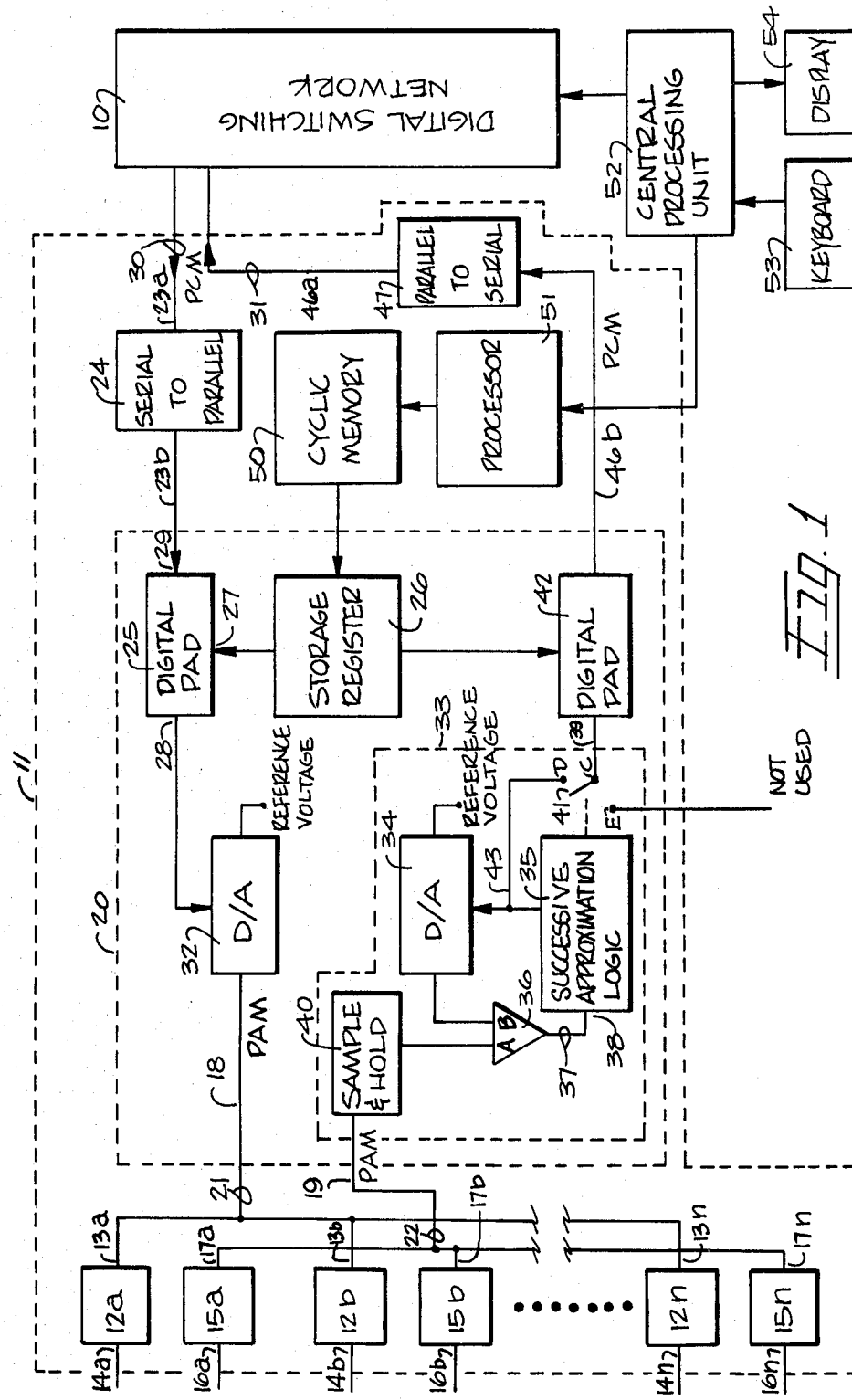
FIG. 1 is a simplified block diagram depicting one embodiment of the invention.

FIG. 1 is a simplified block diagram depicting a simplified embodiment of the present invention. FIG. 1 depicts a digital switching network 10, in simplified form, connected to a trunk module 11, also depicted in simplified form. Trunk module 11 includes sixteen "receive" analogue signal processors 12a through 12n controlled by clock signals not shown; processors 12a through 12n filter and sample the transmitted pulse amplitude modulation (PAM) signals 21 received on their inputs 13a through 13n respectively. The output lines 14a through 14n of the processors 12a through 12n, respectively, carry a continuous analogue signal. Receive processors 12a through 12n are frequently referred to as PAM gates and PCM filters; the term "receive" when applied to processors 12a through 12n is used according to convention.

Trunk module 11 additionally includes sixteen "transmit" analogue signal processors 15a through 15n which filter and sample the continuous analogue signals received on their input lines 16a through 16n, respectively. The outputs 17a through 17n respectively carry transmit PAM signals 22. Processors 15a through 15n are also frequently referred to as PAM gates and PCM filters; the term "transmit" when applied to processors 15a through 15n is used according to convention.

Processors 12a through 12n and processors 15a through 15n are all clocked by clock signals (not shown) so that during any one voice channel only the PAM gate of one receive processor 12a through 12n is operated to sample the PAM signal 21 on bus 18 and only the PAM gate of the corresponding transmit processor 15a through 15n is operated to generate a PAM pulse on bus 19 (note: processor 12a and 15a correspond; processor 12b and 15b correspond, etc.).

All the receive processors 12a through 12n have their inputs 13a through 13n respectively connected to a common PAM receive bus 18. All the transmit processors 15a through 15n have their outputs 17a through 17n respectively connected to a common PAM transmit bus 19.

PAM buses 18 and 19 connect processors 12a through 12n, and 15a through 15n to time-shared codec 20. Serial bus 23a, serial to parallel converter 24, and parallel bus 23b connect codec 20 to digital switching network 10; parallel bus 46b, parallel to serial converter 47, and serial bus 46a also connect codec 20 to digital switching network 10. The interconnections of the various components in codec 20 are depicted in FIG. 1 and attention is directed to that Figure.

Received serial PCM signals 30, transmitted from digital switching network 10, are converted to parallel form by serial to parallel converter 24 and are received by digital pad (code-converter) 25 via PCM bus 23b. Digital pad 25 is a read-only-memory (ROM) device (e.g. model no. 2316 manufactured by INTEL). The operation of pad 25 is controlled by storage register 26 (e.g. Texas Instruments model 74LS374). A digital signal applied to control input 27 of pad 25 controls the PCM code output from terminal 28 of pad 25 for a given PCM code input to input terminal 29 of digital pad 25 in the following manner.

Digital pad 25 contains m "tables" of one hundred and twenty-eight (128) 7-bit locations, each "table" corresponding to a different value of attenuation or gain; in the preferred embodiment of the present invention m equals eight. Each table provides an attenuated or augmented PCM output code (at terminal 28) for each possible PCM input code applied to terminal 29; note that the sign bit of the 8-bit PCM code is not acted upon by pad 25. An n-bit control word, from register 26, is applied to input 27 of digital pad 25 to address the n most significant address bits of digital pad 25, thus providing selection of one of $2^n = m$ possible attentuation or gain values; in the preferred embodiment of the present invention n equals three. The lower significant address bits (7) are the partial PCM signals applied to input terminal 29.

A further control bit, applied to input 27 by register 26, is used to allow the PCM signal on bus 23b to bypass the circuitry of digital pad 25 and be connected directly to output terminal 28, for channels where zero attenuation or gain is desired. More details on the operation of digital pads can be found in U.S. Pat. No. 4,021,652 dated May 3, 1977 to Ernst A. Munter and in U.S. patent application Ser. No. 856,236 filed Dec. 1, 1977 by Ernst August Munter, now U.S. Pat. No. 4,155,070 dated May 15, 1979.

The output of digital pad 25, from terminal 28, is applied to a digital-to-analogue converter 32. The output of converter 32 is a PAM signal on PAM bus 18. One possible device for digital-to-analogue converter 32 is model no. DAC 86 manufactured by P.M.I. (Precision Monolithics Inc.).

PAM bus 19 is applied to input A of analogue-to-digital converter 33 via sample and hold circuit 40. Converter 33 is of conventional design and includes a digital-to-analogue converter 34, successive approximation logic 35 (e.g. SAR 2506 by American Micro Devices) and an analogue comparator 36 (e.g. National Semiconductor LM306) interconnected as shown in FIG. 1. Logic 35 functions by successively testing PCM codes against the PAM input signal from PAM bus 19 (applied to input A of comparator 36 via sample and hold circuit 40). Converter 34 converts the code from logic 35 into an analogue value and applies it to input B of comparator 36. Comparator 36 compares the value of the input on A with the input on B and produces an output signal 37 which is applied to input 38 of logic 35.

Logic 35 uses a "successive approximation" technique whereby logic 35 starts by applying a logic "0" code to digital-to-analogue converter 34. If output signal 37 of comparator 36 indicates that the signal applied to input A of comparator 36 is more negative than the signal applied to input B, the first bit of the PCM code (i.e. the sign bit) is set to a logic "1"; otherwise the bit is left at a logic "0". For each subsequent bit of the PCM code, the bit is first set to a logic "1" and then either left at a logic "1" if output signal 37 from the comparator 36 indicates that the absolute value of the signal at input A is greater than the absolute value of the corresponding test signal applied to input B, or the bit is reset to a logic "0" if output signal 37 indicates otherwise. In this manner, all 8-bits of the PCM code are successively derived, with the sign bit first, the most significant bit next, and so on until the least significant bit is derived. This technique is well known in the art. The PCM code, after being completely derived by logic 35, is then applied to bus 39 (in parallel format) via bus 43 and switching device 41. Switching device 41 is depicted as a simplified single pole double throw (SPDT) switch in order to simplify this description. In actual fact, switching device 41 is a solid-state device capable of switching eight parallel conductors. The dashed line between logic 35 and switching device 41 is used to indicate that the operation of device 41 is controlled by logic 35.

Connected between bus 39 and parallel bus 46b is a digital pad 42. Digital pad 42 is controlled by temporary storage register 26 in the same manner as was pad 25. Parallel bus 46b is applied to a parallel-to-serial converter 47, the output of which is transmitted PCM signal 31 on serial bus 46a. Serial bus 46a connects to digital switching network 10. It should be noted that in the actual implementation of the invention, the function of the digital pads 25 and 42 is performed by a single digital pad that is time-shared between functioning as pad 25 and functioning as pad 42.

An example of the operation of the circuit of FIG. 1 will now be given. As depicted, trunk module 11 of FIG. 1 handles sixteen voice channels out of a total of thirty-two available channels. In other words, if the voice channels are numbered consecutively from 0 through to 31, the circuit of FIG. 1 handles every other voice channel (i.e. either all the odd numbered channels 1, 3, 5,-31 or all the even numbered channels 0, 2, 4, 6,-30). The reason for this is that analogue-to-digital converter 33 needs the time provided by two voice channels in order to produce its output on bus 39; it is not sufficiently fast to do this in the time period of one voice channel.

Digital-to-analogue converter 32 is sufficiently fast to perform its required function in the time period of one voice channel; consequently, in the FIG. 1 embodiment, converter 32 is idle every other voice channel when it could be functioning. In a variation of the embodiment of FIG. 1 (see FIG. 2), a second analogue-to-digital converter 133 is multiplexed to work in cooperation with converter 33 so that the sixteen voice channels not handled by converter 33 can be handled by the second analogue-to-digital converter 133.

Returning now to the embodiment of FIG. 1, and assuming (for exemplary purposes) that the FIG. 1 embodiment is handling the odd numbered voice channels. Let voice channel a be applied to bus 23a (from switching network 10) during channel period 5. At channel period 6 the PAM rendition of channel a is available on PAM bus 18. Also during channel period 6, the PAM signal 22 on bus 19 corresponding to voice channel a occurs. The conversion of this PAM signal occurs in analogue-to-digital converter 33 during channel periods 7 and 8; the output PCM signal from pad 42 is available, in parallel format on bus 46b at the end of channel period 8, and PCM signal 31, in serial form on bus 46a, is available for transmission to switching network 10 during channel period 9.

A cyclic memory 50 (e.g. Intel No. 2125) is employed to store a new code value into temporary storage register 26 for each direction of each voice channel. As its name implies, cyclic memory 50 stores two code values for each voice channel (i.e. a total of thirty-two code values for the particular arrangement depicted in FIG. 1) and simply cycles through these thirty-two code values, at the rate of two every odd voice channel, so that there is associated with each particular voice channel direction (i.e. transmit or receive) one specific predetermined code which determines the variation to be introduced by the digital pads 25 and 42.

Processor 51 (e.g. Intel No. 8085), controlled by central processing unit (CPU) 52, functions to change the codes stored in cyclic memory 50 when desired. A keyboard 53 provides for manual access to CPU 52 and display 54 provides for visual output from CPU 52 to provide a facility for a human operator to access CPU 52 and thereby change the codes stored in cyclic memory 50. It should be noted that in the preferred embodiment of this invention the changing of the codes in memory 50 is done by automatic equipment not shown herein, in order to avoid unduly complicating the description of the invention. CPU 52 also functions to control digital switching network 10.

FIG. 2 depicts the preferred embodiment of the present invention in simplified form. FIG. 2 is the same as FIG. 1 except for the addition or modification of the following components in order to handle thirty-two voice channels as opposed to the sixteen of the FIG. 1 embodiment, (note: when the items are not changed between FIGS. 1 and 2 the same reference characters are employed; where changes or additions have been made in FIG. 2, the numbers in FIG. 2 are increased by one hundred in order to indicate some sort of relationship with similar items in FIG. 1).

Sixteen additional analogue signal processors 112a to 112n inclusive are added and have their inputs 113a to 113n, respectively, connected to PAM bus 118 along with the inputs 13a to 13n of processors 12a to 12n respectively. Sixteen additional transmit analogue signal processors 115a to 115n inclusive are added and they have their outputs 117a to 117n respectively applied to PAM bus 119 along with the outputs 17a to 17n of processors 15a to 15n respectively. Bus 119 carries transmitted PAM signals 122. Bus 119a connects bus 119 to analogue-to-digital converter 33 and bus 119b connects bus 119 to analogue-to-digital converter 133. It should be noted that buses 118, 119, 119a and 119b are all timed-shared buses. Converter 133 is identical to converter 33, except for switching device 41. Items 134, 135, 136 and 140 of converter 133 correspond respectively to items 34, 35, 36 and 40 of converter 33, and operate in a similar fashion. PCM bus 143 connects the output of converter 133 to terminal E of switch 41. Switch 41 is controlled by logic 35 so as to alternate between connecting terminal C to terminal D and terminal C to terminal E. This switching occurs at the rate of once every channel period; i.e. in one channel period switch 41 connects terminals C and D, in the next channel period switch 41 connects C and E, in the following channel period switch 41 connects C and D, etc.

Consequently, bus 39 now carried PCM signals for each of the thirty-two voice channels that appear on the sixteen input lines 16a to 16n inclusive and on the sixteen input lines 116a to 116n inclusive. Similarly, PAM bus 118 now carries thirty-two PAM signals destined for the sixteen output lines 14a to 14n inclusive and for the sixteen output lines 114a to 114n inclusive. Storage register 26 of the time-shared codec 120 functions as it did in the FIG. 1 embodiment by storing two distinct code values every voice channel. Cyclic memory 50 is the same as in FIG. 1 except that for trunk module 111 of FIG. 2, memory 50 stores sixty-four code values (two for each of thirty-two voice channels equals sixty-four) and cycles through these sixty-four code values at the rate of two per voice channel (i.e. one code value for receive and one code value for transmit, for each voice channel). Processor 51, CPU 52, keyboard 53, display 54 and digital switching network 10 all perform in the same manner in both FIGS. 1 and 2.

In a variation of this invention, codec 120 is not time-shared between several signal processors 12, 15, 112, and 115, but rather, codec 120 is dedicated to a single receive analogue signal processor 12a and to a single transmit analogue signal processor 15a. This of course obviates the need for cyclic memory 50, and changes to the code in register 26 are made directly by processor 51.

In a further variation of the FIG. 2 embodiment of this invention, only the receive function is provided. In other words, analogue-to-digital converters 33 and 133 along with their associated equipment (such as processors 15a to 15n and 115a to 115n, digital pad 42, etc,) are not employed and changes in level are made in only one direction (i.e. receive only). As a result, cyclic memory 50 would store only one code value for each channel period (i.e. thirty-two codes for thirty-two voice channels) and storage register 26 would be accessed only once per voice channel (or channel period) by memory 50.

Figure 3:
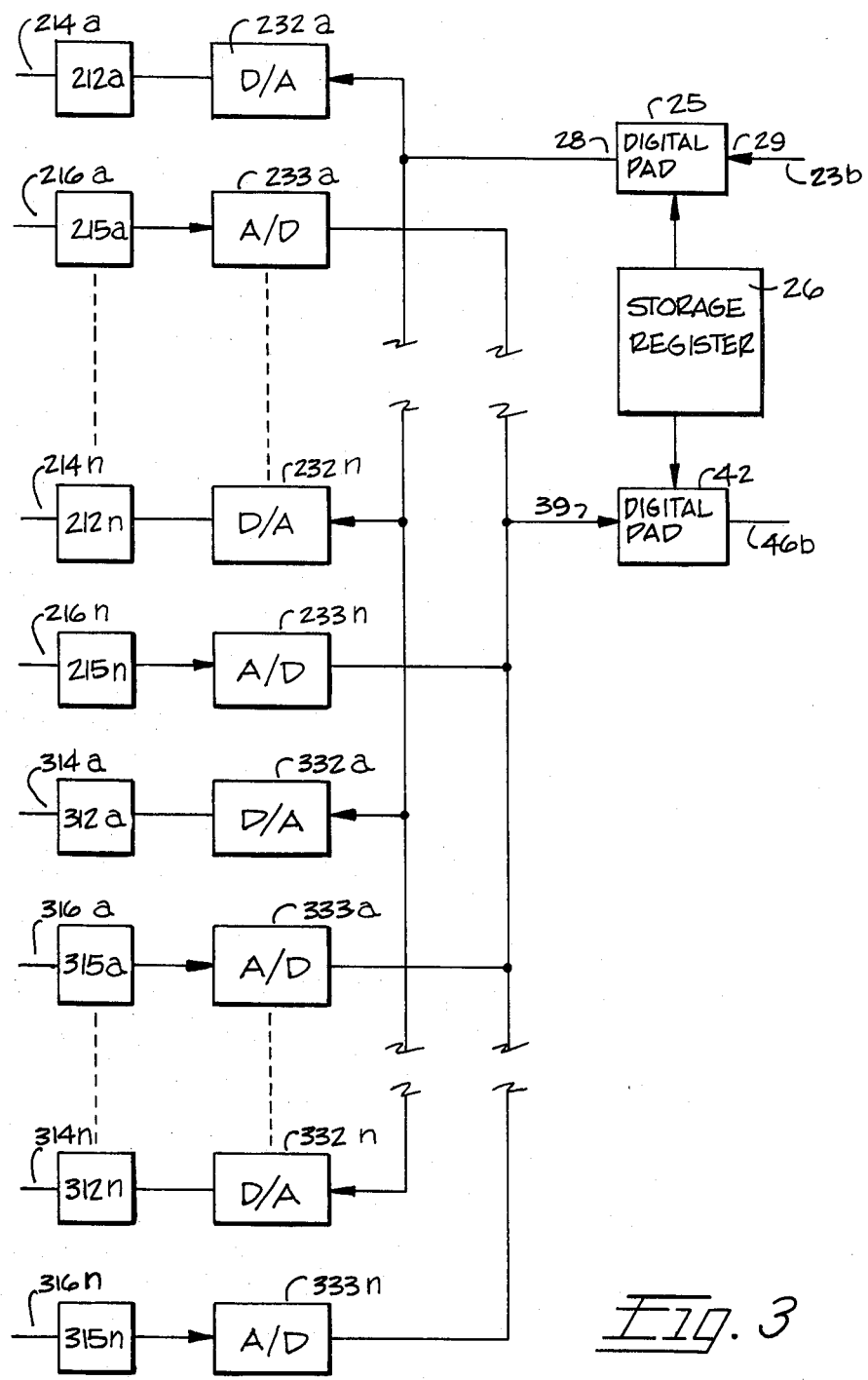
FIG. 3 is a simplified, abbreviated block diagram depicting a further embodiment of the invention.

FIG. 3 depicts a further variation of the present invention, shown at a partial block diagram. In FIG. 3, sixteen receive analogue signal processors 212a to 212n inclusive are responsive to the outputs from sixteen digital-to-analogue converters 232a to 232n, respectively; additionally sixteen receive analogue signal processors 312a to 312n inclusive are responsive to the outputs from sixteen digital-to-analogue converters 332a to 332n, respectively. Note that each digital-to-analogue converter 232a to 232n inclusive, and 332a to 332n inclusive is identical in construction to digital-to-analogue converter 32 of FIG. 2; and each processor 212a to 212n inclusive and each processor 312a to 312n inclusive is identical in construction to processor 12a of FIG. 2. Similarly, the sixteen analogue-to-digital converters 233a to 233n inclusive are responsive to the outputs from the sixteen transmit analogue signal processors 215a to 215n respectively; and the sixteen analogue-to-digital converters 333a to 333n inclusive are responsive to the outputs from the sixteen transmit analogue signal processors 315a to 315n respectively. Note that each analogue-to-digital converter 233a to 233n inclusive, and 333a to 333n inclusive is identical in construction to analogue-to-digital converter 33 of FIG. 2; and each processor 215a to 215n inclusive and each processor 315a to 315n inclusive is identical in construction to processor 15a of FIG. 2.

The remainder of the FIG. 3 circuit functions in the same manner as does the corresponding portion of the FIG. 2 circuit. Digital pads 25 and 42 have been shown in FIG. 3 along with storage register 26. These components are the same in both FIGS. 2 and 3; the remaining components that are common to both FIGS. 2 and 3 have been omitted from FIG. 3 in order to simplify the drawing. The omitted components include serial-to-parallel converter 24, parallel-to-serial converter 47, cyclic memory 50, processor 51, CPU 52, keyboard 53, display 54 and digital switching network 10. These components are interconnected in the same manner in both FIGS. 2 and 3 and they function in the same manner.

In short, the FIG. 3 embodiment employs a separate converter (analogue-to-digital or digital-to-analogue) for each processor 212a to 212n, 215a to 215n, 312a to 312n, and 315a to 315n. The remainder of the circuitry in the FIG. 3 embodiment is the same as for FIG. 2. While converters 232a to 232n, 233a to 233n, 332a to 332n and 333a to 333n have been described in relation to the corresponding converters from the FIG. 2 embodiment, it should be noted that converters having a slower speed of operation (than those in FIG. 2) can be employed in the FIG. 3 embodiment. This is a result of the fact that in FIG. 3, each converter 232a to 232n, 233a to 233n, 332a to 332n, and 333a to 333n need to produce an output only once every thirty-two voice channels. On the other hand, in FIG. 2, converter 32 produced an output once every voice channel and converter 33 produced an output once every two voice channels.

What is claimed is:

1. A conversion circuit for use with a digital telephone switching network, both for converting transmitted pulse amplitude modulation (PAM) signals into transmitted pulse code modulation (PCM) signals and for converting received PCM signals into received PAM signals, said conversion circuit characterized by:
a receive circuit for converting received PCM signals into received PAM signals, said receive circuit comprising a first controllable code-converter means connected in series with the digital input of a digital-to-analogue converter, wherein the input of said first code-converter means is responsive to said received PCM signal, and the output of said first code-converter means is a PCM signal applied to the input of said digital-to-analogue converter, the output of which is said received PAM signal;
a transmit circuit for converting transmitted PAM signals into transmitted PCM signals, said transmit circuit comprising an analogue-to-digital converter connected in series with a second controllable code-converter means, wherein the input of said analogue-to-digital converter is responsive to said transmitted PAM signal, and the output of said analogue-to-digital converter is a PCM signal applied to the input of said second code-converter means, the output of which is said transmitted PCM signal; and
a first storage means for controlling the operation of both the first and the second code-converter means to thereby control the amount of variation of the digital signal passing through said code-converter means and to thereby control the magnitude of any resultant analogue signal derived therefrom,
wherein said first storage means is accessed twice every voice channel in order to store the appropriate digital code, in said first storage means, for controlling the amount of variation caused by said first and second code-converter means.

2. The conversion circuit of claim 1 further including a cyclic memory means, to which said first storage means is responsive, for storing, in a regular order, the digital codes to be stored in said first storage means.

3. The conversion circuit of claim 2 further including a processor means, responsive to the central processing unit of said digital telephone switching network, for selectively altering the digital codes stored in said cyclic memory.

4. The conversion circuit of claim 2 wherein said PCM signals are eight-bit signals, including the sign bit.

* * * * *